United States Patent [19]

Tei

[11] Patent Number: 4,786,819
[45] Date of Patent: Nov. 22, 1988

[54] METHOD OF FABRICATING A CONTACT TYPE COLOR IMAGE SENSOR

[75] Inventor: Sadahiro Tei, Ebina, Japan
[73] Assignee: Fuji Xerox Co., Ltd., Tokyo, Japan
[21] Appl. No.: 873,181
[22] Filed: Jun. 11, 1986
[30] Foreign Application Priority Data
  Jun. 18, 1985 [JP] Japan ................. 60-132690
[51] Int. Cl.$^4$ ............................................ H01L 31/04
[52] U.S. Cl. ................................ 250/578; 358/44; 430/7; 430/642; 250/226
[58] Field of Search ............... 358/41, 44, 48, 43; 430/7, 4, 642; 250/226, 578, 211 J, 211 R

[56] References Cited

U.S. PATENT DOCUMENTS

| | | | |
|---|---|---|---|
| 4,168,448 | 9/1979 | Brault et al. | 358/43 |
| 4,196,009 | 4/1980 | Martin et al. | 358/41 |
| 4,236,098 | 11/1980 | Horak et al. | 358/43 |
| 4,416,961 | 11/1983 | Drexhage | 358/44 |
| 4,547,798 | 10/1985 | Matsumoto et al. | 358/44 |
| 4,658,287 | 4/1987 | Chen | 358/44 |

Primary Examiner—Edward P. Westin
Assistant Examiner—Charles F. Wieland
Attorney, Agent, or Firm—Welsh & Katz, Ltd.

[57] ABSTRACT

A contact type color image sensor comprises a photoelectric converting section comprising a plurality of photoelectric converting elements of sandwich type in which a metallic electrode, a photoelectric converting layer and a light permeable electrode are sequentially formed on an elongated substrate, and a color filtering layer formed on a light receiving area of said photoelectric converting section, wherein said color filter layer comprises a dyeable polymer layer dyed a desirable color.

14 Claims, 2 Drawing Sheets

METHOD OF FABRICATING A CONTACT TYPE COLOR IMAGE SENSOR

BACKGROUND OF THE INVENTION

1. Field of the Invention

The present invention relates to a contact type color image sensor which is enabled to sense a color image by forming color filtering layer on a light receiving area of a contact type image sensor and a method of fabricating the same.

2. Description of the Prior Art

A photoelectric converting element of a sandwich type which uses as its photoconductive layer an amorphous semiconductor thin film made of such material as hydrogenated amorphous silicon (a-si:H), exhibits an excellent photoelectric conversion characteristic, is simple in structure and is easily made to provide a large light receiving area. For these reasons, such elements have found wide applications to original document readers which comprises a contact type image sensor having the same sensor section width as that of original documents. That is, the contact type image sensor is a large-area device not requiring any reduction optical system when reading documents.

For example, as above mentioned, a photoelectric converting element which uses as its photoconductive layer a hydrogenated amorphous silicon layer and which is sandwiched by a metallic electrode and a light permeable electrode exhibits an excellent sensitivity of spectrum in wide range of visible light wave-length from 400 mn to 650 nm, so that a contact type image sensor which reads original color documents by forming predetermined color filters on each of many photoelectric converting elements arranged on a transversely elongated substrate has been proposed.

That is, as shown in FIG. 4 and FIG. 5 (FIG. 5 is a cross-sectional view taken along line A—A in FIG. 4) a contact type color image sensor comprises many photoelectric converting elements in which a photoelectric converting layer 3 made of a hydrogenated amorphous silicon layer is sandwiched by a light permeable electrode 4 made of an indium tin oxide (ITO) thin film and a plurality of metallic electrodes 2 made of a chrome (Cr) thin film separately arranged in a row on an insulating ceramic substrate 1, and on which red transmissive filter 5, green transmissive filter 6 and blue transmissive filter 7 are allocated in sequence corresponding to each of metallic electrodes respectively by such as an vacuum evaporation process.

However, there have been practical difficulties experienced in making it, because formation of a filtering layer by an evaporated process at temperature of over 400° C. results in defects in a hydrogenated amorphous silicon layer.

SUMMARY OF THE INVENTION

The object of the present invention is to provide a contact type color image sensor as practical uses with low fabrication cost and high resolution of color.

In accordance with the present invention, a contact type color image sensor is formed by allocating a plurality of photoelectric converting elements on a transversely elongated substrate, in which a photoelectric converting layer is sandwiched by a metallic electrode and a light permeable electrode, and forming a filtering layer made of a dyeable polymer dyed a desirable color respectively on each of photoelectric converting elements. In accordance with a method of fabricating a contact type color image sensor of the present invention, after forming a plurality of photoelectric converting elements of sandwich type on a transversely elongated substrate, each color filter is formed sequentially by dyeing an animal protein film such as gelatin and casein, or dyeing a polymer such as acrylic lic resin added base of dye, preferably its relief pattern.

Specifically, a passivation film may be desirably formed between a light receiving area and a color filtering layer to be used as a protective film and prevention film to dyeing. Since a color filtering layer formed by dyeing a relief of an animal protein film or dyeable polymer such as acrylic resin added base of dye can keep a high dimensional accuracy, a contact type color image sensor of the present invention can provide not only maximum of a light receiving area but also high yield and color resolution.

Further, an image sensor of the present invention having high reliability can be fabricated while avoiding defects in the sensor characteristic because there is no requirement for processing a substrate at a high temperature.

Furthermore, according to a method of the contact type color image sensor of the present invention, since a color filtering layer is formed by dyeing a dyeable polymer after forming a photoelectric converting section, the photoelectric conversion characteristic of the section can be kept good because of no requirement for processing at high temperature. Furthermore, after forming a passivation film on a photoelectric converting section for using as a protection film and prevention film for dye, the first relief pattern made of a dyeable polymer such as an animal protein film is formed, dyed and fixed, and then the first color filter is completed, and subsequently the second color filter is completed after the second relief pattern is formed, dyed and fixed. Thus, each of color filters is formed so that a contact type color image sensor having high reliability can be simply fabricated with high dimensional accuracy, because no requirement for a high temperature process does not cause any defect of photoelectric conversion characteristic in a substrate.

DESCRIPTION OF THE PREFERRED EMBODIMENTS

Figure 1:
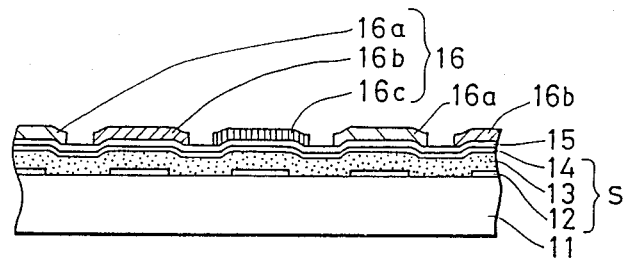
FIG. 1 is a brief cross-sectional view of a part of a contact type color image sensor in accordance with a embodiment of the present invention.

A contact type color image sensor in accordance with an embodiment of the present invention, as shown a brief cross-sectional view of a part of the same sensor in FIG. 1, comprises a photoelectric converting section S having many photoelectric converting elements in a row in which a metallic electrode 12 divided to multiple patterns made of a chrome thin film, a photoelectric converting layer 13 made of a hydrogenated amorphous silicon layer and a light permeable electrode 14 made of an indium tin oxide layer are sequentially formed on an insulating ceramic substrate 11, a passivation film 15 made of a UV acrylic resin film covering a section S, and a filtering layer 16 made of a gelatin film formed above a film 15.

The filtering layer 16 is made of a gelatin film dyed a color corresponding to each photoelectric converting element, and in which red, green and blue transmissive filters are sequentially allocated.

Figure 2A:
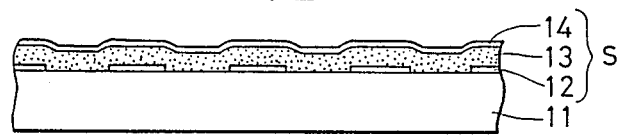
FIGS. 2 (a) to (e) are cross-sectional views for explaining a method of fabricating the same sensor.

Next, how to fabricate the contact type color image sensor will be described. First of all, as shown in FIG. 2(a), a metallic electrode 12, a photoelectric converting layer 13 and a light permeable electrode 14 are sequentially formed on a ceramic substrate 11 by the usual process, and subsequently a photoelectric converting section S is formed.

Figure 2B:
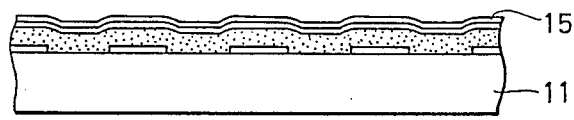

Then, UV acrylic resin is coated on the section S to a thickness of about 5 μm by a roll coat process and subjected to cure ten seconds by irradiation of 80 W/cm using UV cure light to form a UV acrylic resin as a passivation film 15 as shown in FIG. 2(b). At this process, an output portion of an electrode is covered with a photomask to avoid illumination of UV light and subjected to be exposed after illumination.

Figure 2C:
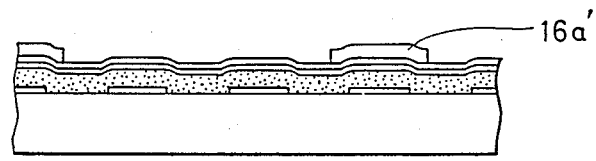
Figure 2D:
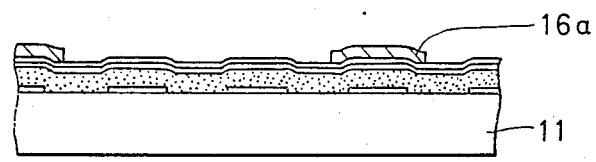

Next, a coating liquid made of gelatin of light molecular weight (30,000 to 50,000) to which heavy chromate ammonium of 20 weight %, silane coupling agent of weight and water are added to cause the gelatin concentration to become 20%, is coated on the passivation film 15 and subsequently subjected to illumination (5 seconds) to the restricted portion 16a corresponding to a red transmissive filter, and to develop by bubbling for 3 minutes in water to form the first relief pattern 16a' as shown in FIG. 2(c). Then, a red transmissive filtering layer, as shown in FIG. 2(d), is formed by dyeing 3 minutes in dye bath using acid dyestuff of pH3 and 80° C. in order to allow red light to transmit, after burning at 120° C. After that, said red transmissive filtering layer is fixed by soaking into liquid of pH3 and 30° C. added tannin acid of 1 weight %.

Figure 2E:
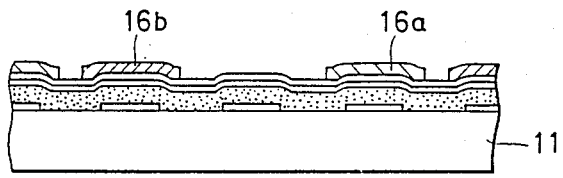

Continuously, said coating liquid of gelatin is coated again on all over the plane as set forth above and subjected to illumination (5 seconds) to the restricted portion 16b corresponding to a green transmissive filter, and developed by bubbling for 3 minutes in warm water to form the second relief pattern 16b' as shown in FIG. 2(e). Then, dyeing is done in order to allow green light to transmit in the same manner as case of red, wherein, the red transmissive filter 16a formed already does not dye and keeps stable because it is fixed. Further, a green transmissive filtering layer 16b is formed by the fixing process.

Finally, a blue transmissive filtering layer 16c is formed in the same manner, and then a contact type color image sensor as shown in FIG. 1 is completed.

The thus-fabricated contact type color image sensor provides high reliability because provision of the passivation film enables protection of a photoelectric conversion section and prevention of dyeing, and since formation of each color filter can be done with high accuracy, a larger area of light receiving can be provided , so that design flexibility is enhanced and resolution of color is better.

Further, since it is not necessary to process at a high temperature because formation of a filter layer is done by dyeing the relief of gelatin film, no defect is caused in the photoelectric conversion section, and subsequently high reliability of the sensor can be maintained. Furthermore, since formation of each color filter is done in sequence, that is, formation and dyeing of relief of the second color filter is done after dyeing and fixing of the first color filter, only the relief of the second color filter is dyed without dyeing the fixed first color filter or color mixture. Thus, fabrication is simple.

Dyeing has been done dividing 3 colors of red, green and blue in the foregoing embodiment, but the number of colors and actual colors formed may be changed as necessary.

A gelatin film has been used as a filter layer in the foregoing embodiment, but other dyeable animal protein film such as casein film or other dyeable polymers such as acrylic resin, adding dye base, may be used.

Figure 3:
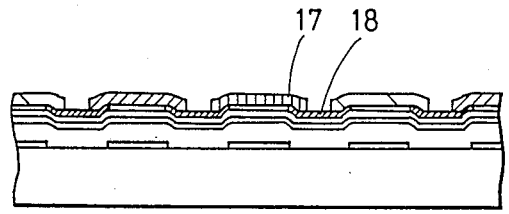
FIG. 3 is a cross-sectional view of a part of a contact type color image sensor in accordance with another embodiment of the present invention.
Figure 4:
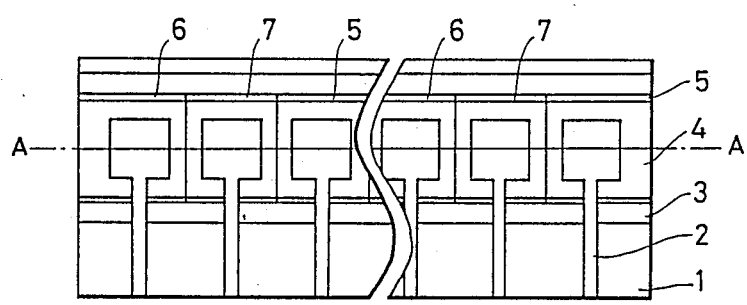
FIG. 4 and FIG. 5 show a basic structure of a contact type color image sensor in accordance with the prior art.
Figure 5:
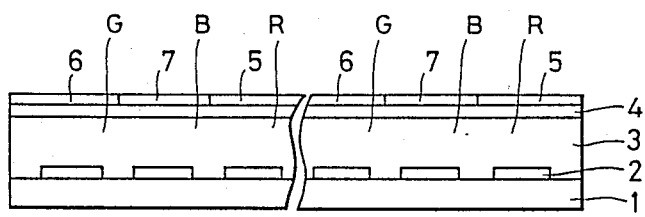

Further, a photoresist such as poly vinyl cinnamid may be used as a passivation film the other than UV acrylic resin. However, the step of forming a passivation film may be omitted. In addition, a light-shielding film has not been formed in the foregoing embodiment, but, as shown in FIG. 3, a light-shielding film 18 made of a gelatin film dyed black and having a light permeable opening window 17 may be formed between a passivation film and a filter layer. The light-shielding film 18 is formed by the step of coating a gelatin film on a passivation film and then dyeing the gelatin film selectively. The other steps of formation are the same as the embodiment previous described above. Also, a metallic film formed of Al, Cr, Au, Pt, Ru, or Mo on ITO film or passivation film by an evaporated process may be used as a light-shielding film.

In this case, said light permeable opening window is formed by photo-lithoetching process.

What is claimed is:

1. A method of fabricating a contact type color image sensor at low temperature comprising the steps of forming a plurality of photoelectric converting elements having light receiving areas on a substrate; forming a passivation film on selected light receiving areas, forming a light shielding film on said passivation film by depositing a thin film of metal selected from the group consisting of Al, Cr, Au, Pt, Ru, or Mo and forming a color filter on other selected light receiving areas of each photoelectric converting element by forming a dyeable polymer layer and dyeing said dyeable polymer layer, wherein said step of forming said color filter comprises the steps of:

forming a first relief pattern made of a dyeable polymer layer corresponding to a first group of said photoelectric converting elements, dyeing said first relief pattern, forming a first color filter by fixing said first relief pattern thus dyed, forming a second relief pattern made of a dyeable polymer layer corresponding to a second group of said photoelectric converting elements, dyeing said second relief pattern, and forming the second color filter by fixing said second relief pattern thus dyed.

2. A method as set forth in claim 1, wherein said step of forming a color filter comprises the steps of;

forming a first relief pattern made of a dyeable polymer layer corresponding to a first group of said photoelectric converting elements, dyeing said first relief pattern, forming a first color filter by fixing said first relief pattern thus dyed, forming a second relief pattern made of a dyeable polymer layer corresponding to a second group of said photoelectric converting elements, dyeing said second relief pattern, and forming the second color filter by fixing said second relief pattern thus dyed.

3. A method as set forth in claim 1 wherein said dyeable polymer layer comprises a pattern made of an animal protein.

4. A method as set forth in claim 3, wherein said animal protein is selected from the group consisting of gelatin or casein.

5. A method as set forth in claim 1 wherein said dyeable polymer layer is made of acrylic resin.

6. A method of fabricating a contact type color image sensor as set forth in claim 1, wherein said step of forming a light-shielding film comprises a step of coating a gelatin film and a step of dyeing said gelatin film selectively.

7. A method of fabricating a contact type color image sensor comprising the steps of forming a plurality of photoelectric converting elements to be juxtaposed on an elongated substrate, and forming a color filter on a light receiving area of each photoelectric converting element, wherein said step of forming said color filter comprises the sequential steps of:

forming a first relief pattern of a dyeable polymer layer corresponding to a first group of said photoelectric element, dyeing said relief pattern, forming a first color filter by fixing said first relief pattern thus dyed, forming a second relief pattern of a dyeable polymer layer corresponding to a second group of said photoelectric converting elements, dyeing said second relief pattern, and forming the second color filter by fixing said second relief pattern thus dyed.

8. A method of fabricating a contact type color image sensor comprising the steps of forming a plurality of photoelectric converting elements to be juxtaposed on an elongated substrate, forming a passivation film, and forming a color filter on a light receiving area of each photoelectric converting element, where said step of forming a color filter comprises the sequential steps of:

forming a first relief pattern of a dyeable polymer layer on said passivation film of a first group of said photoelectric converting elements, dyeing said first relief pattern, forming a first color filter by fixing said first relief pattern thus dyed, forming a second relief pattern of a dyeable polymer layer on said passivation film of a second group of said photoelectric converting elements, dyeing said second relief pattern, and forming the second color filter by fixing said second relief pattern thus dyed.

9. A method as set forth in claim 8, wherein said dyeable polymer layer comprises a pattern made of an animal protein.

10. A method as set forth in claim 8, wherein said animal protein is gelatin or casein.

11. A method as set forth in claim 8, wherein said dyeable polymer layer is made of acrylic resin.

12. A method of as set forth in claim 8, wherein said photoelectric converting layer is made of a hydrogenated amorphous silicon layer.

13. A method of fabricating a contact type color image sensor as set forth in claim 8, wherein said step of forming said color filter comprises a step of forming a light-shielding film on said passivation film, said light-shielding film having a light permeable opening window defining a light receiving area of each photoelectric converting element.

14. A method of fabricating a contact type color image sensor as set forth in claim 13, wherein said step of forming a light-shielding film comprises a step of depositing a thin film of metal, wherein said metal is a material selected from the group consisting of Al, Cr, Au, Pt, Ru, and Mo, on said passivation film by an evaporation process, and a step of etching away said thin film selectively.

* * * * *